(12) United States Patent
Yamazaki et al.

(10) Patent No.: US 7,678,624 B2
(45) Date of Patent: Mar. 16, 2010

(54) SEMICONDUCTOR DEVICE AND METHOD FOR MANUFACTURING SAME

(75) Inventors: Shunpei Yamazaki, Tokyo (JP); Takeshi Fukunaga, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/519,514

(22) Filed: Sep. 12, 2006

(65) Prior Publication Data

US 2007/0010075 A1    Jan. 11, 2007

Related U.S. Application Data

(62) Division of application No. 10/882,790, filed on Jul. 1, 2004, now Pat. No. 7,118,994, which is a division of application No. 09/262,657, filed on Mar. 4, 1999, now Pat. No. 6,759,677.

(30) Foreign Application Priority Data

Mar. 5, 1998    (JP)    ................... 10-071311

(51) Int. Cl.
*H01L 21/84* (2006.01)
(52) U.S. Cl. ................. 438/151; 438/795; 257/E21.372
(58) Field of Classification Search ................. 438/149, 438/151; 257/E21.372
See application file for complete search history.

(56) References Cited

U.S. PATENT DOCUMENTS

| | | |
|---|---|---|
| 4,357,179 A | 11/1982 | Adams et al. |
| 4,728,370 A | 3/1988 | Ishii et al. |
| 4,891,074 A | 1/1990 | Ovshinsky et al. |
| 5,032,193 A | 7/1991 | Ovshinsky et al. |
| 5,250,818 A | 10/1993 | Saraswat et al. |
| 5,371,035 A * | 12/1994 | Pfiester et al. .............. 438/439 |
| 5,424,244 A | 6/1995 | Zhang et al. |
| 5,510,146 A | 4/1996 | Miyasaka |
| 5,594,569 A | 1/1997 | Konuma et al. |
| 5,614,733 A | 3/1997 | Zhang et al. |
| 5,643,826 A | 7/1997 | Ohtani et al. |
| 5,648,277 A | 7/1997 | Zhang et al. |

(Continued)

FOREIGN PATENT DOCUMENTS

JP    6-82818    3/1994

(Continued)

OTHER PUBLICATIONS

King, T-J et al, "Polycrystalline Silicon-Germanium Thin-Film Transistors," IEEE Transactions on Electron Devices, vol. 41, No. 9, Sep. 1994, pp. 1581-1591.

(Continued)

*Primary Examiner*—Bradley K Smith
(74) *Attorney, Agent, or Firm*—Cook Alex Ltd.

(57) ABSTRACT

Disclosed is a semiconductor device having a driver circuit operable at high speed and a method for manufacturing same. An active matrix liquid crystal display device uses a polysilicon film for its TFT active layer constituting a pixel matrix circuit because of low off current characteristics. On the other hand, a TFT active layer constituting driver circuits and a signal processing circuit uses a poly silicon germanium film because of high speed operation characteristics.

12 Claims, 7 Drawing Sheets

U.S. PATENT DOCUMENTS

| | | | |
|---|---|---|---|
| 5,700,333 | A | 12/1997 | Yamazaki et al. |
| 5,830,784 | A | 11/1998 | Zhang et al. |
| 5,859,443 | A | 1/1999 | Yamazaki et al. |
| 5,889,292 | A | 3/1999 | Sameshima et al. |
| 5,897,347 | A | 4/1999 | Yamazaki et al. |
| 5,915,174 | A | 6/1999 | Yamazaki et al. |
| 5,932,892 | A | 8/1999 | Hseuh et al. |
| 5,932,893 | A | 8/1999 | Miyanaga et al. |
| 5,953,597 | A | 9/1999 | Kusumoto et al. |
| 5,961,743 | A | 10/1999 | Yamazaki et al. |
| 5,962,871 | A | 10/1999 | Zhang et al. |
| 5,977,559 | A | 11/1999 | Zhang et al. |
| 6,093,587 | A | 7/2000 | Ohtani |
| 6,100,465 | A | 8/2000 | Shinohara et al. |
| 6,153,893 | A | 11/2000 | Inoue et al. |
| 6,160,271 | A | 12/2000 | Yamazaki et al. |
| 6,380,590 | B1 | 4/2002 | Yu |
| 6,506,636 | B2 * | 1/2003 | Yamazaki et al. .......... 438/149 |
| 6,787,807 | B2 * | 9/2004 | Yamazaki et al. ............ 257/65 |
| 2003/0054593 | A1 | 3/2003 | Yamaguchi et al. |
| 2004/0041190 | A1 | 3/2004 | Yamazaki et al. |

FOREIGN PATENT DOCUMENTS

| | | |
|---|---|---|
| JP | 06-349735 | 12/1994 |
| JP | 09-266313 | 10/1997 |
| JP | 9-266313 | 10/1997 |
| JP | 09-312260 | 12/1997 |

OTHER PUBLICATIONS

Mayer, J.W. et al, *Electronic Materials Science: For Integrated Circuits in Si and GaAs*, chapter 6.8, "Gettering in Si," MacMillan Publishing Company, New York, NY, pp. 176-179, (1990).

King, T.J. et al, "Polycrystalline Silicon-Germanium Thin-Film Transistors," IEEE Transactions on Electron Devices, vol. 41, No. 9, pp. 1581-1591, (Sep. 1994).

Yoshida, T. et al, "A Full-Color Thresholdless Antiferroelectric LCD Exhibiting Wide Viewing Angle with Fast Response Time," SID 97 Digest, pp. 841-844, (1997).

Furue, H. et al, "Characteristics and Driving Scheme of Polymer-Stabilized Monostable FLCD Exhibiting Fast-Response Time and High Contrast Ratio with Gray-Scale Capability," SID 98 Digest, pp. 782-785, (1998).

* cited by examiner

DRIVER CIRCUIT | PIXEL MATRIX CIRCUIT

SEMICONDUCTOR DEVICE AND METHOD FOR MANUFACTURING SAME

This application is a divisional of U.S. application Ser. No. 10/882,790, filed on Jul. 1, 2004 now U.S. Pat. No. 7,118,994, which is a divisional of U.S. application Ser. No. 09/262,657 filed on Mar. 4, 1999 (now U.S. Pat. No. 6,759,677 issued Jul. 6, 2004).

BACKGROUND OF THE INVENTION

1. Field of the Invention

The present invention relates to an active matrix semiconductor device integrally formed, on a common substrate, with a matrix circuit serving as an image display section or photoelectric conversion section and a driver circuit (drive circuit) to drive the matrix circuit.

2. Description of the Conventional Art

Recently attentions are drawn to semiconductor devices having a circuit formed by a plurality of thin film transistors (hereinafter abbreviated as TFTs) on a glass substrate. Such semiconductor devices involves image display devices, such as liquid crystal displays and EL (electroluminescence) displays.

In particular active matrix display devices formed with pixel matrix and driver circuits on one common substrate are occupying steady positions for next generation displays taking place of CRT, by virtue of their capabilities to display images with precision in comparison with conventional passive type display devices.

The realization of such active matrix display devices have been contributed by the existence of semiconductor called polysilicon (polycrystalline silicon or fine crystalline silicon). Before utilizing polysilicon, the passive type display devices have utilized amorphous silicon for TFT active layers. However there has been a drawback that the TFT operating speed is too low to constitute driver circuits.

Meanwhile, the TFT utilizing polysilicon active layers can realize several hundreds to several thousands times the field effect mobility as compared with the amorphous silicon used TFT. This has made it possible to form a high performance driver circuit on a common substrate to a matrix circuit.

Thus the active matrix display devices could be realized by gaining the material of polysilicon. At the present the marketplace has grown to an extent that they are built, as image display monitors, in electronic appliances, such as video cameras and notebook personal computers.

However, demands are raised toward higher precision of image displays as the active matrix display is put into general home use. Moreover, there is also a demand for devising in order to realize higher performance active matrix displays. It is becoming important as a means for achieving this to enhance the driveability for the driver circuit.

It is basically important to reduce the off current (the drain current when the TFT is off) for TFTs formed as pixels for the matrix circuit, wherein the requirement is low for the mobility. On the contrary, the driver circuit TFTs require extremely high field effect mobility for processing a great deal of information signals.

For example, the digital broadcast video signals are transmitted at high frequency, e.g., several tens of MHz (e.g., 80 MHz). On the circuit side, even if signal division or the like is carried out, the shift register circuit must be driven at 10 to 20 MHz. Such high frequency drive requires a field effect mobility of at least 200 cm$^2$/Vs or higher.

Due to these demands, attempts have been made in various ways in order to increase the TFT mobility. There is, among them, a report on a technology to use silicon germanium ($Si_{1-x}Ge_x$: where 0<X<1) for the active layer.

Silicon germanium which is narrow in energy band gap as compared to that of silicon can form a channel region with high carrier density. This results in an advantage to provide higher field effect mobility, as compared to the case using silicon for the active layer.

However, there encounters a problem that the off current be increased correspondingly to the increase of carrier density, as compared to the TFT with silicon. Due to this, this technology is not applicable for forming pixel matrix circuits as mentioned before, thus involving a factor to decelerate the applicability to the active matrix display devices.

SUMMARY OF THE INVENTION

It is therefore an object of the present invention to provide a method for manufacturing a semiconductor device having a driver circuit capable of high speed operation, and a semiconductor device manufactured by the same method.

The present invention is characterized in that a TFT active layer is formed by selecting a proper semiconductor material depending on the performance required by a circuit to be formed. That is, concretely, TFTs including an active layer formed of silicon germanium ($Si_{1-x}Ge_x$: where 0<X<1) and TFTs including an active layer formed of silicon (Si) are provided on a common substrate.

The silicon germanium is preferably of polysilicon because of enabling high speed operation. However, it may be amorphous as the case may be. Also, the silicon may be of polysilicon or amorphous.

The most basic concept of the invention lies in that silicon germanium for realizing high field effect mobility is used for circuit TFTs requiring driving at several tens MHz, such as in driver and signal processing circuits for example of an active matrix liquid crystal display device. Furthermore, it is effective to use rather silicon for a pixel matrix circuit requiring low off current characteristics.

The preset invention is characterized by separately use semiconductor materials for TFT active layers on a common substrate. By doing so, attempt is made to improve the performance of the semiconductor device.

DETAILED DESCRIPTION OF THE INVENTION

Figure 1:
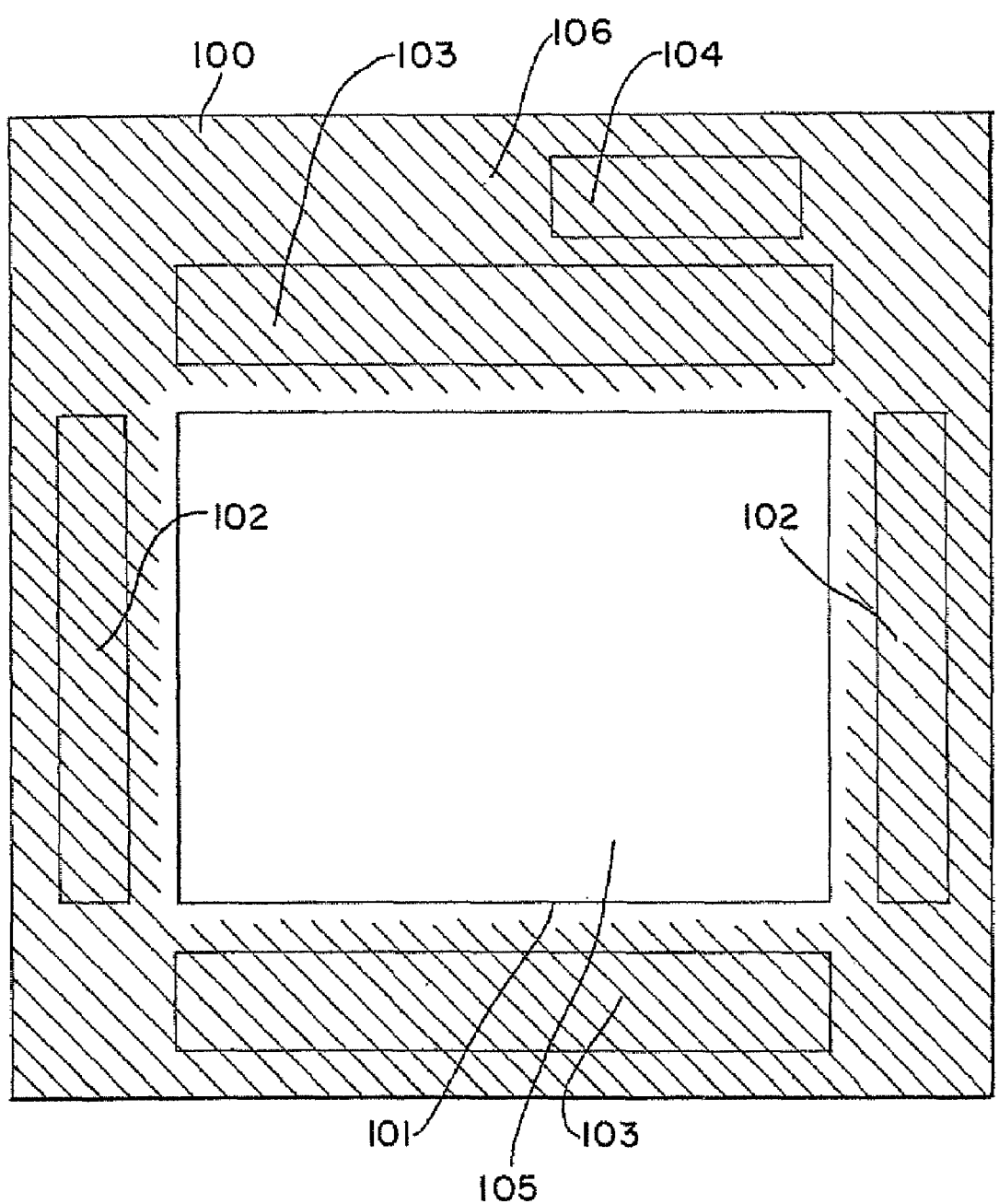
FIG. 1 is a view showing an outside appearance of an active matrix substrate.

Explanation will be made on an embodiment of the present invention with reference to FIG. 1. In FIG. 1, there is illustrated a schematic structural view of a display device of an active matrix type, wherein numeral 100 is a substrate, 101 a pixel matrix circuit, 102 a gate driver circuit, 103 a source driver circuit, and 104 a signal processing circuit (signal dividing circuit, etc.).

In the present invention, the pixel matrix circuit 101 is structured by a TFT group having an active layer formed by a polysilicon film. On the other hand, the other circuits, i.e., the gate driver circuit 102, the source driver circuit 103, and the signal processing circuit 104, have TFT group active layer using a polycrystalline silicon germanium film (hereinafter referred to as a poly silicon germanium film) in order to effect high speed operation.

That is, the region shown at 105 (the plain region) in FIG. 1 is structured by the TFTs having the polysilicon film as an active layer. The region shown at 106 (the hatched region with oblique lines) is structured by the TFTs having the poly silicon germanium film as an active layer.

In this manner, it is the most important feature of the present invention that the poly silicon germanium film is formed by selectively adding germanium for the circuit section requiring high speed characteristics, while the polysilicon film is used for the circuit section requiring low off current characteristics.

The present invention constructed as above will be explained with greater detail based on examples described hereinunder.

EXAMPLE 1

In this example, an active matrix display device is manufactured as an example having a pixel matrix circuit and a driver circuit (a CMOS circuit is exemplified as a basic unit) formed on an insulating surface of a substrate. This example is explained on a process of forming a substrate with TFTs (referred to as an active matrix substrate), with reference to FIGS. 2A to 2E.

First, a glass substrate 201 is prepared to form thereon an underlying layer 202 of a silicon oxide film. An amorphous silicon film 203 is formed thereon by a plasma CVD method to a thickness of 30 nm.

Figure 2A:
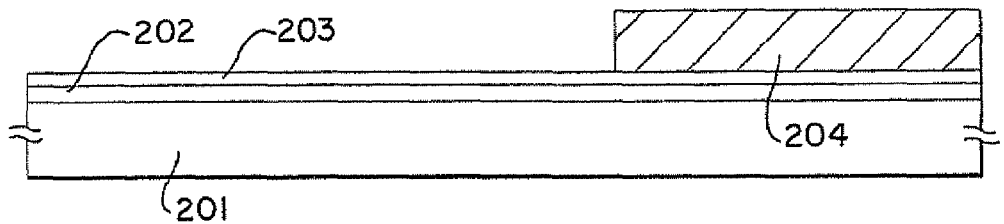
FIGS. 2A to 2E are views showing a manufacturing process of TFTs.

Then a resist mask 204 is provided by patterning on the amorphous silicon film 203. This resist mask 204 is formed in a manner covering the region to be formed with a TFT group for a pixel matrix circuit. That is, an unmasked state is provided for the region to be formed with the circuits, such as a driver circuit and signal processing circuit, requiring high speed characteristics. (FIG. 2A)

Figure 2B:
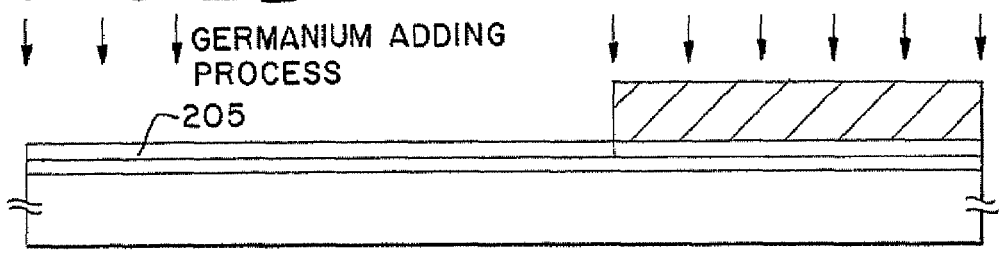

After providing the resist mask 204, germanium is added by using a technique such as ion implantation, plasma doping or laser doping. (FIG. 2B)

At this time, although the adding conditions may be appropriately determined by the practitioner, there is a necessity of adding germanium to fulfill a composition of $Si_{1-x}Ge_x$ (0<X<1). This example employs such a condition of ion addition that addition is made with a concentration of $1 \times 10^{14}$ to $5 \times 10^{19}$ atoms/cm$^3$ into the amorphous silicon film 203.

The region where germanium is added (germanium added region) 205 is changed into an amorphous form due to bombardment upon addition. The addition of germanium provides a silicon germanium region in an amorphous state.

Because germanium is a catalytic semiconductor material to accelerate amorphous silicon crystallization, it largely contributes to reducing an energetic barrier required for crystallization in the later crystallizing process.

Next, the resist mask 204 is removed and then a nickel containing layer 206 is formed by using a technique described in JP-A-7-130652, which in turn corresponds to a U.S. Pat. No. 5,643,826. An entire disclosure of the JP-A-7-130652 and the U.S. Pat. No. 5,643,826 is incorporated herein by reference. Besides nickel, one or a plurality of elements selected from cobalt, iron, copper, palladium, platinum, gold and indium are used as a catalytic element to accelerate silicon crystallization. Note that metals such as nickel are referred to as a catalytic material in this specification.

Figure 2C:
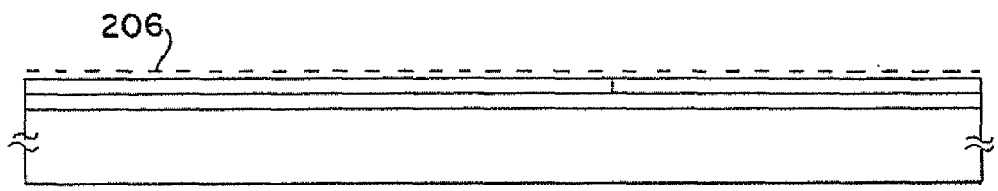

Although a means of adding nickel to an entire surface of the amorphous silicon and a means of selective addition are known, either means may be adopted to carry out the present example. Besides nickel, it is possible to use other catalytic elements described above. (FIG. 2C)

Figure 2D:
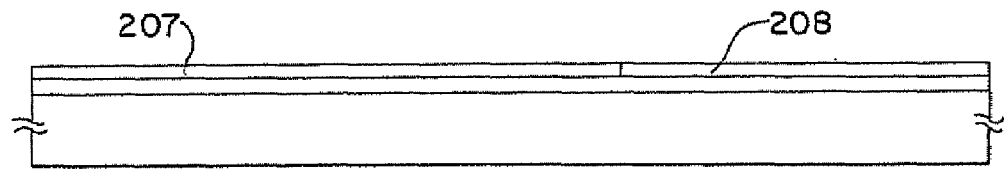

In this example, a nickel containing layer 206 is formed over the entire surface of the amorphous silicon film and the amorphous silicon germanium film, and then a process of crystallization is performed by furnace anneal after dehydrogen. (FIG. 2D)

The crystallization process in this example includes a thermal treatment at 600° C. for 8 hours. Due to this heat treatment, the silicon film completely crystallizes to form a poly silicon germanium region 207 and a polysilicon region 208. It is needless to say that the crystallizing condition is not limited to the condition of this example. The thermal treatment can be carried out by using lamp anneal or laser anneal.

Incidentally, in this crystallization process the above-stated catalytic semiconductor material (germanium) and catalytic metal material (nickel) serves to simultaneously accelerate crystallization of the amorphous silicon film. It can be said that, with the present example structure, crystallization is made by the combination of the catalytic semiconductor material and the catalytic metal material.

Figure 2E:
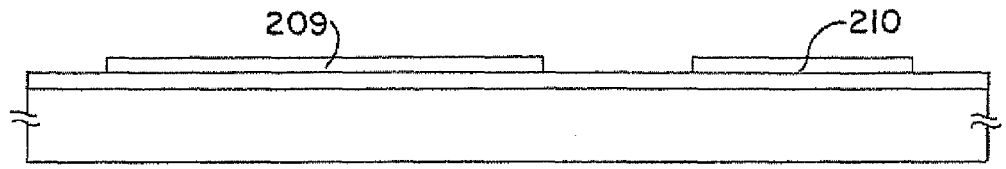

The poly silicon germanium region 207 and the polysilicon region 208 thus formed are patterned into active layers 209, 210. The active layer 209 formed by the poly silicon germanium region 207 at this time is for an active layer of TFTs for constituting later a driver circuit and a signal processing circuit. On the other had, the active layer 210 formed by the polysilicon region 208 is for an active layer of a TFTs for constituting later a pixel matrix circuit. (FIG. 2E)

Then a source region, a drain region and a lightly doped impurity region (hereinafter referred to as an LDD region) are formed by using a technique described in JP-A-7-135318, which in turn corresponds to U.S. Pat. No. 5,648,277. An entire disclosure of JP-A-7-135318 and U.S. Pat. No. 5,648,277 is incorporated herein by reference. This process is briefly explained.

First, an island pattern, to be later formed into a gate electrode, is formed by using an aluminum film containing scandium by 2 wt %. Note that the island pattern, although all made in a single gate structure, may be formed by a multi-gate structure such as double or triple gate form.

Nextly anodic oxidation is made for the island pattern to form a porous anodic oxide film on side walls of the island pattern. Then the solution is changed to further carry out anodic oxidation to form a compact anodic oxide film around the island pattern.

After forming the porous anodic oxide film and the compact anodic oxide film in this manner, a gate dielectric film is etched by using a dry etch method. After completing the etching for the gate dielectric film, the porous anodic oxide film is removed away, thus obtaining a state of FIG. 3A.

Figure 3A:
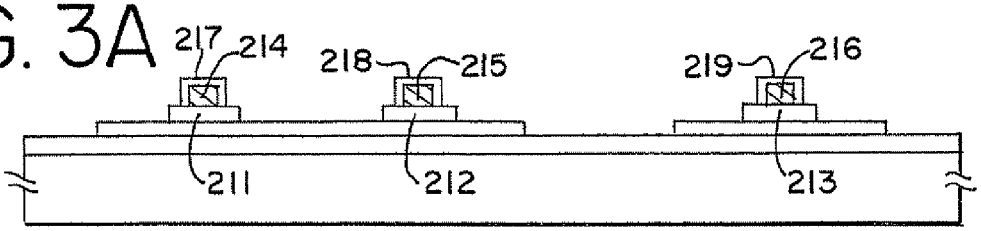
FIGS. 3A to 3D are views showing a manufacturing process of TFTs.

In FIG. 3A, numeral 211, 212 and 213 are gate insulating films formed by silicon oxide films, numeral 214, 215 and 216 are gate electrodes formed by aluminum films including scandium, and numeral 217, 218 and 219 are compact anodic oxide films for protecting the gate electrodes.

After obtaining a state of FIG. 3A, the area to be formed later into a P channel TFT is covered by a mask 220 to add impurity ions (phosphorus or arsenic) for providing an n-type conductivity. This process is carried out twice by using different acceleration voltages. As to concrete conditions, it is preferred to refer to JP-A-7-135318 and U.S. Pat. No. 5,648, 277 stated before.

Figure 3B:
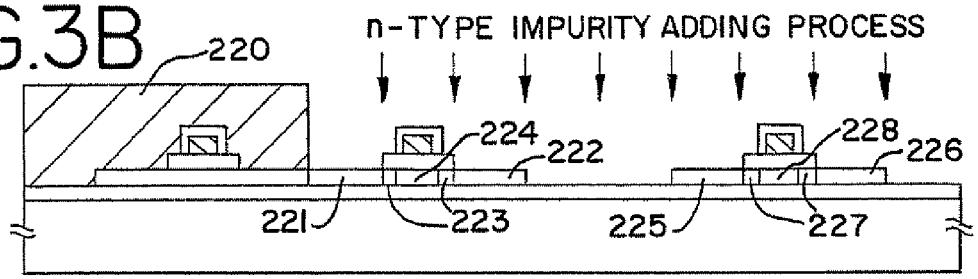

This process results in formation of a drain region 221, source region 222, LDD region 223 and a channel region 224 of an N channel TFT for constituting a driver circuit. Also, formed are a source region 225, drain region 226, LDD region 227 and a channel region 228 of an N channel TFT for constituting a pixel matrix circuit. (FIG. 3B)

Next the resist mask 220 is removed away and a resist mask 229 is formed to cover, at this time, a region to be formed into an N channel TFT. Then impurity ions (boron) are added to provide a p-type conductivity using two different acceleration voltages.

Figure 3C:
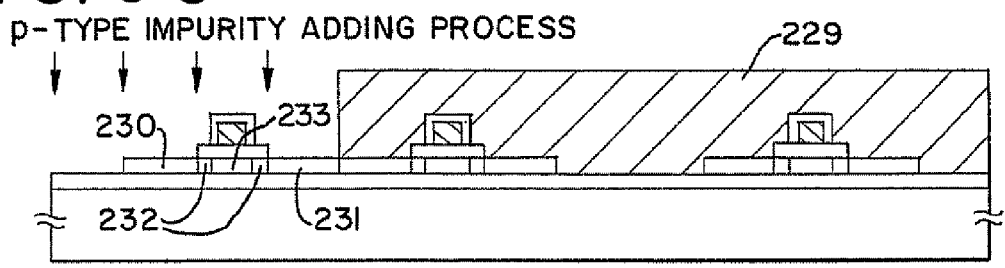

This process forms a source region 230, drain region 231, LDD region 232 and channel region 233 of a P channel TFT constituting for a driver circuit. (FIG. 3C)

After forming the source region and the drain region by the impurity ion adding process in this manner, the added impurity ions are activated by using any of the means of furnace anneal, lamp anneal and laser anneal.

Next a first interlayer insulating film 234 is formed and contact holes are opened therein to form source electrodes 235, 236, 237 and drain electrodes 238, 239. Note that the insulating layer 234 may use a material selected from silicon oxide, silicon nitride, silicon oxy-nitride and resin film.

At this time point, the TFTs for the driver circuit is completed. The process from now on is for manufacturing TFTs for a pixel matrix circuit.

After forming the source electrode and the drain electrode, a second interlayer insulating film 240 is formed and then a black mask 241 comprising a titanium film is formed thereon. Incidentally, if partly removing the second interlayer insulating film at a position over the drain electrode 239 prior to forming a black mask 241, it is possible to form a auxiliary capacitance of the black mask, the second interlayer insulating film and the drain electrode.

Next a third interlayer insulating film 242 is formed over the black mask 241 and a contact hole is formed therein, and a pixel electrode 243 comprising a transparent conductive film (typically indium tin oxide) is formed thereon.

Figure 3D:
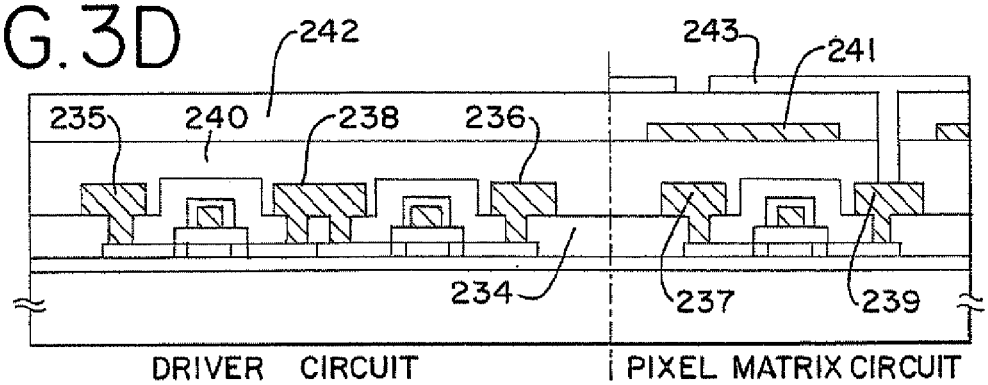

In this manner, an active matrix substrate structured by TFTs as shown in FIG. 3D is completed has integrally formed driver and pixel matrix circuits. It is a matter of course that the CMOS circuit constituting the driver circuit can constitute other signal processing circuits. That is, it is possible to form a driver circuit and a signal processing circuit with using the poly silicon germanium region.

The active matrix substrate formed as above is put together with an opposite substrate through a known cell assembling process. An active matrix type liquid crystal display device can be manufactured by filling a liquid crystal material between two substrates opposed each other as shown in FIG. 4.

Figure 4:
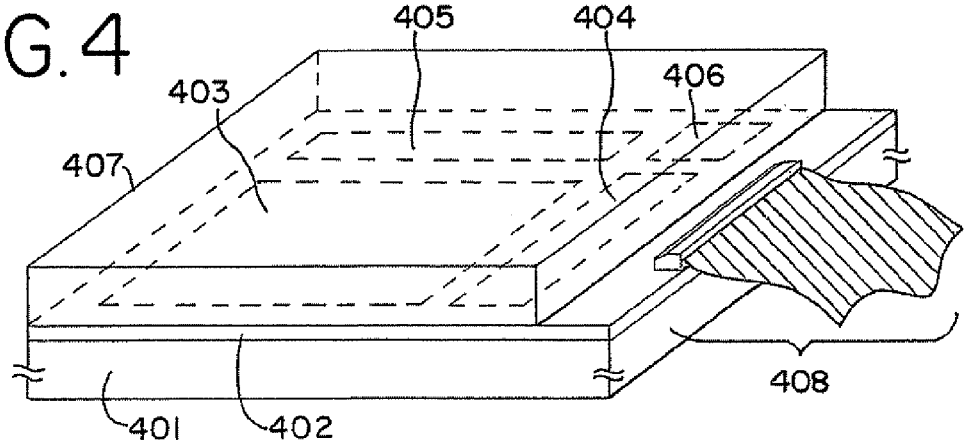
FIG. 4 is a view showing an outside appearance of an active matrix liquid crystal display device.

Incidentally, in FIG. 4, numeral 401 is a substrate, 402 an underlying layer comprising an silicon oxide film, 403 a pixel matrix circuit, 404 a source driver circuit, 405 a gate driver circuit and 406 a signal processing circuit.

Here, the pixel matrix circuit 403 is structured by TFT as those on the right side in FIG. 3D, while the driver circuits 404, 405 and the signal processing circuit 406 are structured by a CMOS circuit as those on the left side in FIG. 3D.

Also, numeral 407 is an opposite substrate that cooperates with the above-mentioned active matrix substrate to hold a liquid crystal layer (not shown). Numeral 408 is a terminal section for external signal electrical connection, which is called FPC (Flexible Print Circuit). This is connected to an interconnect group exposed by cutting one end surface of the opposite substrate.

Various liquid crystal materials such as twisted nematic liquid crystal, polymer dispersion liquid crystal, ferroelectric liquid crystal, anti-ferroelectric liquid crystal, or a mixture of ferroelectric and anti-ferroelectric liquid crystals may be used in the liquid crystal layer.

The active matrix liquid crystal display device thus manufactured adopts the poly silicon germanium film for active layer of TFTs constituting the driver and signal processing circuits, realizing high field effect mobility and hence a circuit suited for high speed operation. Meanwhile, the pixel matrix circuit can constitute a matrix circuit with TFTs excellent in low off-current characteristics despite inferior to the TFTs using the poly silicon germanium film in respect of high speed operation characteristics.

The structure of the present invention is not limited to the TFT structure shown in the present embodiment but can adopt any of known structures. It is therefore possible to constitute the circuit not only by top-gate type TFTs but also by bottom-gate TFTs (typically inverted stagger TFTs).

EXAMPLE 2

In example 1 the catalytic element (nickel) was used to promote crystallization of the amorphous silicon film during its crystallization process. In this example one example is explained on a case of not using nickel with reference to FIGS. 5A and 5B.

First, a state of FIG. 2B is obtained according to the process of Example 1. Then the resist mask 204 is removed away to carry out a heat treatment at 500° C. for 8 hours. Note that the process temperature is preferably determined in a range of 450 to 600° C. with the process time of 4 to 12 hours.

Figure 5A:
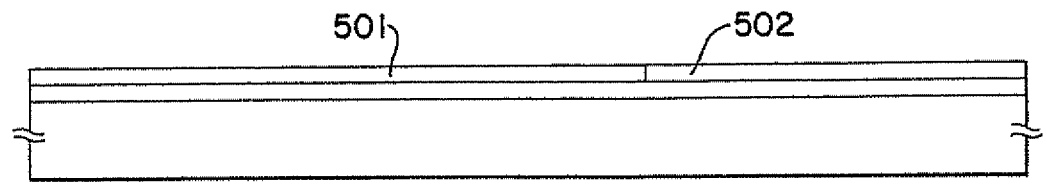
FIGS. 5A and 5B are views showing a manufacturing process of TFTs.

In a process of FIG. 5A, crystallization proceeds through the catalytic action of germanium at the region added by germanium, forming a poly silicon germanium region 501. However, natural nucleation can almost neglected for the region not added by germanium. Accordingly, substantial crystallization does not proceed thus forming an amorphous silicon region 502.

In this manner, the heat treatment condition in this example is required to select such a temperature and time that crystallization perfectly occur at the region added by germanium without crystallization at the non-added region. For example, the heat treatment may preferably be 4 hours in the case of 600° C. and 8 hours in the case of 500° C.

Figure 5B:

The obtained silicon film having poly silicon germanium and amorphous silicon regions is patterned as shown in FIG. 5B to form an active layer 503 comprising a poly silicon germanium film and an active layer 504 comprising an amorphous silicon film. If carrying out the process as in Example 1, an active matrix liquid crystal device can be manufactured.

As described above, in the structure of the present example each active layer of TFTs constituting the driver and signal processing circuits is formed by utilizing the poly silicon germanium region while each active layer of TFTs constituting the pixel matrix circuit is formed by utilizing the amorphous silicon region.

In also this case, the driver and signal processing circuits used poly silicon germanium thus enabling high speed operation. The pixel matrix circuit used amorphous silicon that can suppress against off-current as compared with polysilicon, thereby enabling to structure a circuit excellent in low off-current characteristics.

EXAMPLE 3

There was shown in Example 2 the case that the heat treatment process was carried out with such a temperature and time that can cause crystallization only at the region added by germanium. In this example, however, explanation is made with reference to FIGS. 6A and 6B for a case where heat treatment is carried out under conditions that can cause crystallization due to natural nucleation also at a region not added by germanium.

First, a state of FIG. 2B is obtained according to the process of Example 1. Then the resist mask 204 is removed away to carry out a heat treatment at 600° C. for 24 hours. Note that the process temperature is preferably determined in a range of 550 to 650° C. with the process time of 12 to 48 hours.

Figure 6A:
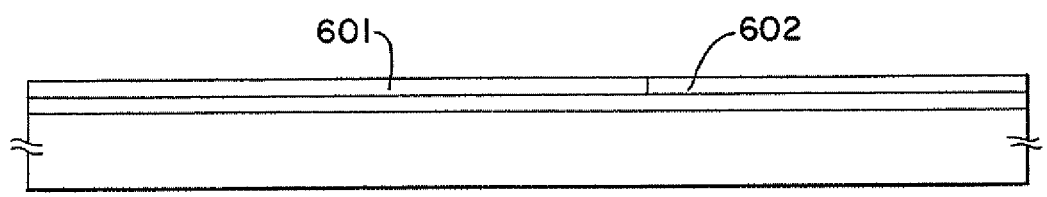
FIGS. 6A and 6B are views showing a manufacturing process of TFTs.

In a process of FIG. 6A, crystallization proceeds through the catalytic action of germanium at the region added by germanium, forming a poly silicon germanium region 601. Simultaneously, natural nucleus development occur at the region not added by germanium thus forming a polysilicon region 602.

The heat treatment condition in this example is required to determine considering a relationship of temperature and time wherein crystallization can occur in the amorphous silicon film due to natural nucleation. For example, a heat treatment of approximately 48 hours is required for a process temperature of 550° C. If 650° C. a process time may be approximately for 12 hours.

Figure 6B:

The obtained silicon film having poly silicon germanium and polysilicon regions is patterned as shown in FIG. 6B to form an active layer 603 comprising a poly silicon germanium film and an active layer 604 comprising a polysilicon film. If carrying out the process as in Example 1, an active matrix liquid crystal device can be manufactured.

As described above, in the structure of the present example each active layer of TFTs constituting the driver and signal processing circuits is formed by utilizing the poly silicon germanium region while each active layer of TFTs constituting the pixel matrix circuit is formed by utilizing the polysilicon region crystallized through natural nucleus development.

EXAMPLE 4

Figure 7A:
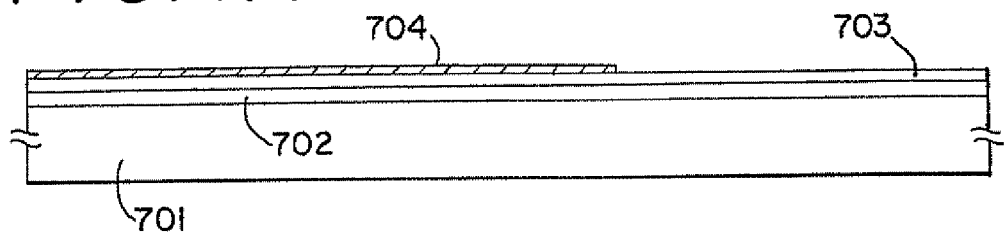
FIGS. 7A to 7C are views showing a manufacturing process of TFTs.
Figure 7B:
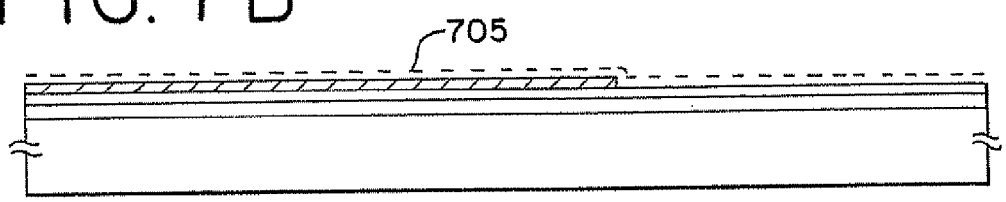

Explained in this example is a case that a different means is used to add germanium in Examples 1 to 3, with reference to FIGS. 7A and 7B. Specifically, a case is shown wherein germanium is added utilizing a germanium film as a diffusion source.

First, an underlying layer 702 comprising a silicon oxide film is formed on a glass substrate 701, and an amorphous silicon film 703 is formed thereon. A germanium film 704 is further formed thereon to a thickness of 10 to 100 nm (typically 20 to 50 nm).

The germanium film 704 is formed using a known means and then patterned, being left at sites to be formed later with TFTs for driver and signal processing circuits. The germanium may be etched by a hydrogen fluoride solution.

If obtaining a state of FIG. 7A, a nickel containing layer 705 is formed by a spin coat technique method utilizing a technique described in JP-A-7-130652 and U.S. Pat. No. 5,643,826. In such a case, it is preferred to provide at this time a thin oxide film over a surface of the silicon film and germanium film for the purpose of improving wettability.

Figure 7C:
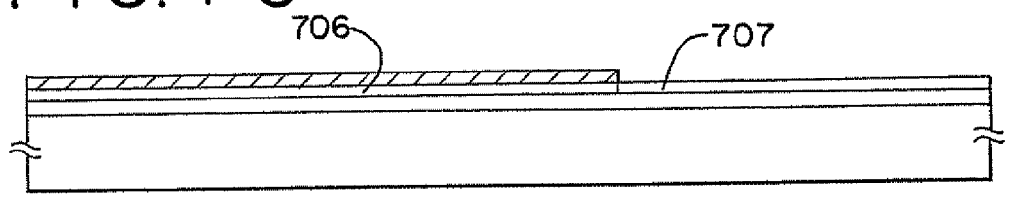

Then heat treatment is carried out at 600° C. for 8 hours to cause crystallization in the silicon film. This process forms a poly silicon germanium region 706 at a site with germanium film 704 and a polysilicon region 707 at a site directly contacted with the nickel containing layer. (FIG. 7C)

Thereafter, after removing the germanium film 704, TFTs for driver and signal processing circuits as well as a pixel matrix circuit are formed according to the process of Example 1. Thus an active matrix liquid crystal display device as shown in FIG. 4 is realized.

EXAMPLE 5

Figure 8A:
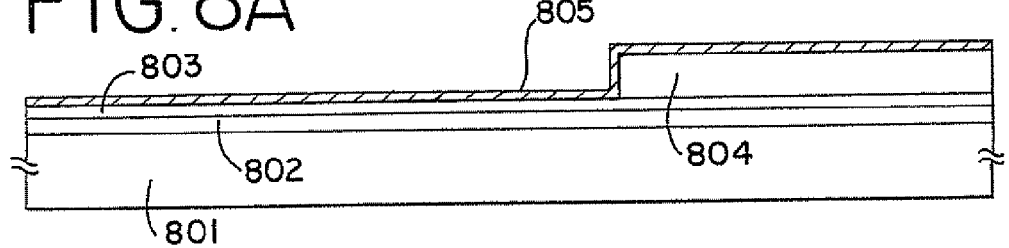
FIGS. 8A and 8B are a views showing a manufacturing process of TFTs.
Figure 8B:
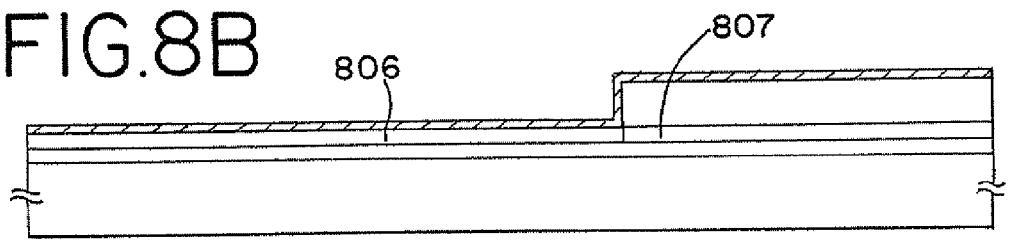

In this example, explanation is made on a case that the crystallization process is carried out by using a germanium film with a structure different from Example 4, with reference to FIGS. 8A and 8B.

First, an underlying layer 802 comprising a silicon oxide film is formed on a glass substrate 801, and an amorphous silicon film 803 is formed thereon. On the amorphous silicon is formed an insulating film 804 comprising a silicon oxide film or silicon nitride film. This insulating film 804 after film formation is patterned into a form to cover only areas to be formed later into a pixel matrix circuit.

Then a germanium film 805 is formed by a known film forming method. The film thickness may be selected in a range of 10 to 100 nm. (FIG. 8A)

After forming the germanium film 805, a heat treatment process is carried out in that state to cause crystallization. In this example, this heat treatment is performed at 600° C. for 24 hours (under a condition that the amorphous silicon perfectly crystallizes due to natural nucleation). (FIG. 8B)

In this process, a poly silicon germanium region 806 is formed in the region contacted with the germanium film 805 while a polysilicon region 807 is formed due to natural nucleation in the region masked by the insulating film 804.

Incidentally, only the region to be formed into a pixel matrix circuit may be formed as an amorphous region by conducting a heat treatment under a condition that crystallization proceeds through the catalytic action of germanium without almost no crystallization due to natural nucleation, as was explained in Example 2.

If the crystallization process completes, the insulating film 804 and the germanium film 805 are removed. Thereafter an active matrix liquid crystal display device may be manufactured according to the process of Example 1.

EXAMPLE 6

Figure 9:
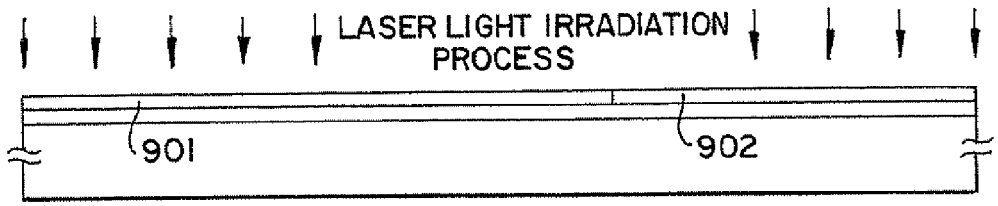
FIG. 9 is a view showing a manufacturing process of TFTs.

In this example, explanation is made on an example wherein a crystallinity improving process is carried out by laser light irradiation after performing a silicon film crystallizing process, with reference to FIG. 9.

First, a state of FIG. 2D is obtained according to the process of Example 1. In this state, an excimer laser light is irradiated to cause an amorphous ingredient remaining in the poly silicon germanium region 207 and the polysilicon region 208 to perfectly crystallize.

Also, laser light irradiation thermal energy eliminates defects and the like existing in the crystal grains of the poly silicon germanium region 207 and the polysilicon region 208. As a result, a poly silicon germanium region 901 and a polysilicon region 902 are obtained with high crystallinity.

Note that the structure of this example is not limited to Example 1 but may be applicable to any of the cases of Examples 2 to 5. That is, it is satisfactory to achieve a structure that the crystallization process is effected by a furnace anneal and then the crystallinity is improved by laser light irradiation.

EXAMPLE 7

Figure 10:
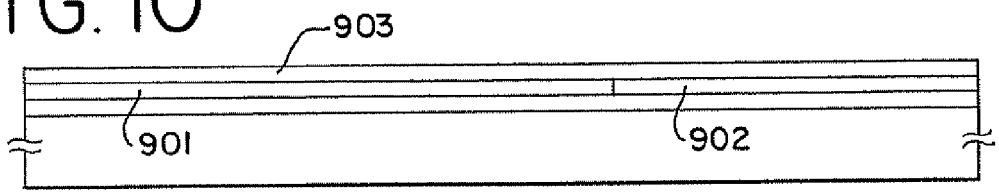
FIG. 10 is a view showing a manufacturing process of TFTs.

In this example, explanation is made on a case added with a process that the catalytic element (nickel) having been utilized upon crystallization in Example 1 is removed by gettering after the crystallization process, with reference to FIG. 10.

First, a state of FIG. 2D is obtained according to the process of Example 1. Note that in this example there is necessity to employ as a substrate a heat resistant quartz substrate, ceramic substrate, ceramic glass substrate or silicon substrate.

A heat treatment is carried out in an oxidizing atmosphere containing halogen elements at 950° C. for 30 minutes. In this process, nickel remained in the silicon film is gettered by the halogen elements and removed in a volatile gaseous form. Incidentally, further concrete reference to this gettering process may be made to JP-A-9-312260, which in turn corresponds to a pending U.S. application Ser. No. 08/785,489. An entire disclosure of JP-A-9-312260 is incorporated herein by reference. (FIG. 10)

This process removes metal element nickel from the silicon film formed by the poly silicon germanium region and the polysilicon region. It is possible to exclude the unstable factor that may have an effect on the TFT characteristic.

That is, this makes it possible to obtain the poly silicon germanium region 901 and the polysilicon region 902 that are thoroughly reduced of nickel concentration in the film.

Also, the gettering process in this example is performed typically at a temperature of 800 to 1100° C. It is therefore possible to effectively vanish the defects (stacking fault, dislocation, etc.) included in the individual crystal grains of the silicon film. In particular, it is known that thermal oxide film formation greatly contributes to defect vanishment. In the present example case, the defects in crystal grains are greatly reduced by forming the thermal oxide film 903.

Because of an effect to enhance adhesion to the underlying film, it is possible to prevent defects from occurring again in crystal grains or so upon cooling the silicon film.

The silicon film thus formed is structured by gathering of rod-formed or flat-rod-formed crystals. There is a feature that, in crystal grain boundaries formed by individual rod-formed crystals, 90% or more of the crystal lattices are observed to have continuity between the different crystal grains.

That is, it was confirmed that, when crystal grain boundaries and their vicinities are observed by a high resolution TEM, crystal lattice fringes despite crossing the grain boundary keep their continuity thus realizing highly matched lattice bonding. This is a crystal structure unique to a silicon film crystallized using nickel. The silicon film in the present example is a film nearly of a single crystal or substantially considerable as a single crystal because defects within the crystal grains are reduced in addition to the above.

In this manner, after performing the process of gettering the catalytic element, the silicon film is patterned to form an active layer. After this, an active matrix liquid crystal display device may be manufactured according to the process of Example 1.

According to the present example structure, because the poly silicon germanium film and the polysilicon film can be improved in crystallinity drastically, it is possible to realize a higher performance of an active matrix liquid crystal display device.

EXAMPLE 8

Figure 11A:
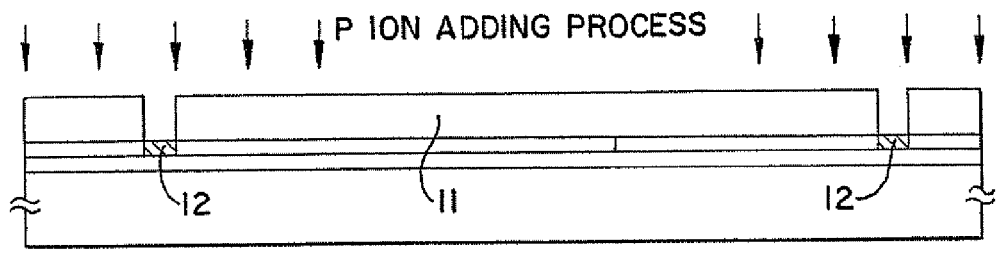
FIGS. 11A and 11B are views showing a manufacturing process of TFTs.
Figure 11B:
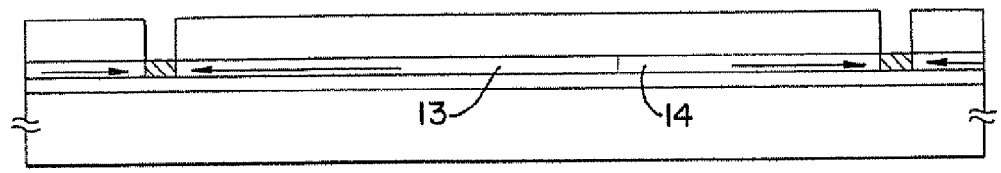

In this example, explanation is made on a structure to remove by gettering nickel by a means different from that of Example 7, with reference to FIGS. 11A and 11B.

First, a state of FIG. 2D is obtained according to the process of Example 1. Then, a silicon oxide is formed to form an opening therein, forming a mask insulating film 11. After forming the mask insulation film 11, an element selected from the group 15 (typically phosphorus) is added to form a phosphorus added region 12. (FIG. 11A)

After forming the phosphorus added region 12, a heat treatment is made at 600° C. for 12 hours to cause gettering of the nickel remained in the poly silicon germanium and polysilicon regions into the phosphorus added region 12. This process utilizes an effect that a metal element is gettered by using phosphorus.

This process removes nickel from the film to thereby form a poly silicon germanium region 13 scarcely containing nickel and a polysilicon region 14. It is noted that, although there practically is remained approximately $1 \times 10^{15}$ to $1 \times 10^{16}$ atoms/cm$^3$ of nickel, there is no affection in TFT characteristics.

After this, the mask insulating film 11 is removed and then an active matrix liquid crystal display device can be realized according to the process of Example 1.

Also, if a heat treatment process (thermal oxide film forming process or the like) at 800 to 1100° C. are added after carrying out the gettering process with phosphorus as shown in this example, the adhesion is increased between the underlying layer and the silicon film with reduced or vanished defects within crystal grains, obtaining a silicon film with high crystallinity.

EXAMPLE 9

In this example, explanation is made on a case of a hybrid active matrix liquid crystal display device combined with IC, which is different from the active matrix liquid crystal display device with the structure shown in Example 1.

Figure 12:
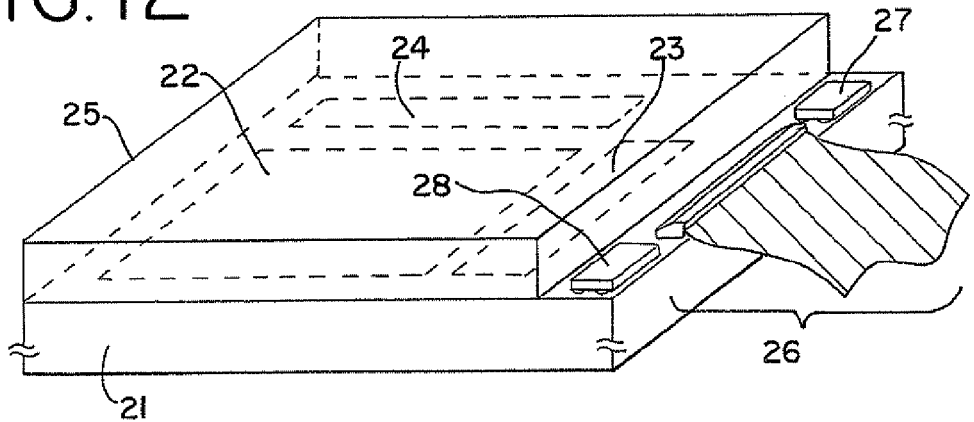
FIG. 12 is a view showing an outside appearance of an active matrix liquid crystal display device.

FIG. 12 shows a structure of an active matrix liquid crystal display device according to the present example. In FIG. 12, numeral 21 is an active matrix substrate formed with a pixel matrix circuit 22, a source driver circuit 23 and a gate driver circuit 24. 25 is an opposite substrate and 26 is an FPC.

This example is characterized in that IC chips 27, 28 are mounted by utilizing a surface for mounting with the FPC 26. These IC chips are structured by forming on a silicon substrate various circuits, such as a video signal processing circuit, timing pulse generating circuit, gamma correction circuit, memory circuit, arithmetic operation circuit, and so on.

Although two chips are mounted in FIG. 12, the chips may be just one or a plurality of number.

EXAMPLE 10

The structures shown in Examples 1 to 8 is not limited to the active matrix liquid crystal display device but can be applied to various electro-optical apparatuses having a driver circuit and a matrix circuit on a common substrate. Such electro-optical apparatuses includes an EL (electroluminescence) display device, image sensor, and so on.

Also, the basic technical idea of the present invention lies in that a poly silicon germanium film is used for the TFTs having importance in high-speed operation characteristics while a polysilicon or amorphous silicon film is used for the other TFTs without importance in high-speed operation characteristics.

Therefore, the application of the present invention is not limited to electro-optical apparatus but also applicable to semiconductor circuits such as operation processing circuits including micro-processors formed by an IC chip and high frequency modules (MMIC, etc.) for dealing with input/output signals for portable appliances.

EXAMPLE 11

The active matrix electro-optical apparatuses and semiconductor devices shown in Examples 1 to 10 can be utilized as display and signal operating circuits for various electronic appliances. Note that the electronic appliances mentioned in this example is defined as a product mounting with an electro-optical apparatus or semiconductor circuit as a part.

Such electronic appliances involves video cameras, still cameras, projectors, projection TVs, head-mount displays, car navigation, personal computers (including notebook type), portable information terminals (mobile computers, handy phones, etc.). Examples of these appliances are shown in FIGS. 13A to 13F.

Figure 13A:
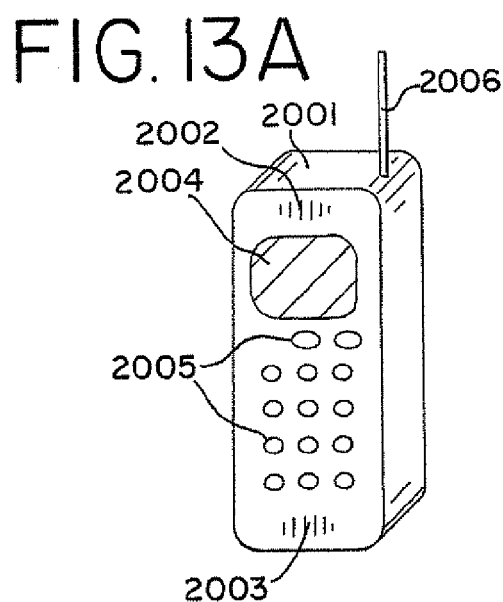
FIGS. 13A to 13F are views showing examples of electronic appliances.

FIG. 13A is a handy phone, which is structured by a main body 2001, a sound output section 2002, a sound input section 2003, a display unit 2004, operation switches 2005 and an antenna 2006. The present invention is applicable to the sound output section 2002, the sound input section 2003 and the display unit 2004.

Figure 13B:
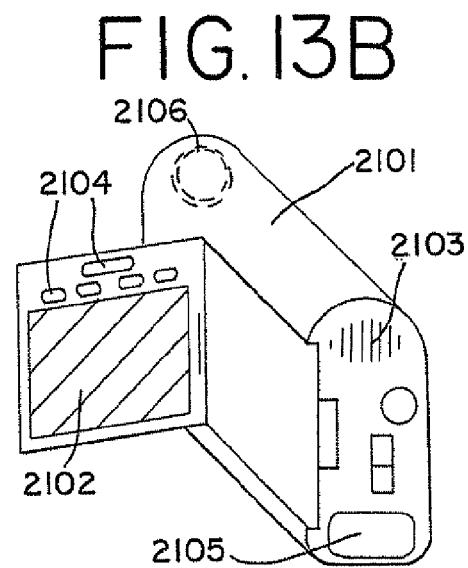

FIG. 13B is a video camera, which is structured by a main body 2101, a display unit 2102, a sound output section 2103, operation switches 2104, a battery 2105 and an image receiving section 2106. The present invention is applicable to the display unit 2102 and the sound input section 2103.

Figure 13C:
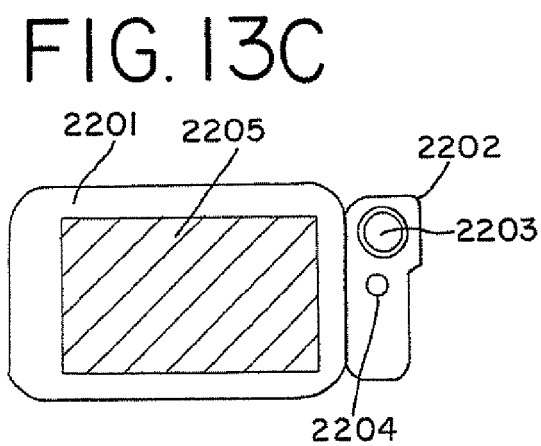

FIG. 13C is a mobile computer, which is structured by a main body 2201, a camera section, 2202, an image receiving section 2203, operation switches 2204 and a display unit 2205. The present invention is applicable to the image receiving section 2203, the display unit 2205, etc.

Figure 13D:
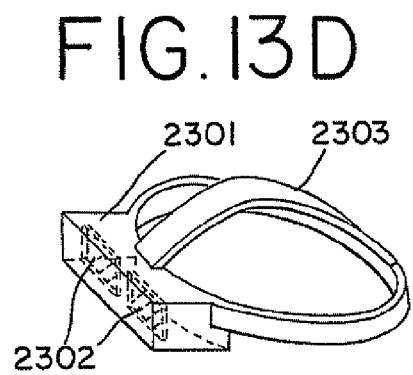

FIG. 13D is a head-mount display, which is structured by a main body 2301, a display unit 2302 and a band section 2303. The present invention is applicable to the display unit 2302.

Figure 13E:
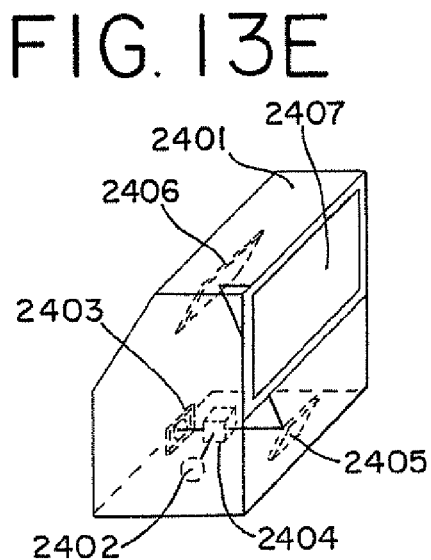

FIG. 13E is a rear-type projector, which is structured by a main body 2401, a light source 2402, a display unit 2403, a polarized beam splitter 2404, reflectors 2405, 2406 and a screen 2407. The present invention is applicable to the display unit 2403.

Figure 13F:
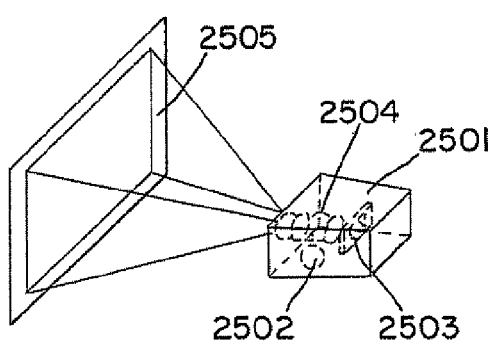

FIG. 13F is a front-type projector, which is structured by a main body 2501, a light source 2502, a display unit 2503, an optical system 2504 and a screen 2505. The present invention is applicable to the display unit 2503.

As described above, the present invention covers a broad range of applications and is applicable to almost all electronic appliances. Besides the above, the invention can be utilized for electric signboard, advertising displays and so on.

With the structure of the invention it is possible to form TFTs using a poly silicon germanium film only at a region requiring especially high speed operation characteristics thereby configuring circuits with desired operation performances.

In this manner, it is possible for the practitioner to selectively form active layers in a manner suited for TFT characteristics required by the circuit by providing both the poly silicon germanium film and the polysilicon film (or amorphous silicon film) on a common substrate.

What is claimed is:

1. A method for manufacturing a semiconductor device, comprising:

forming a semiconductor film comprising silicon having a first region and a second region on an insulating film;

adding germanium to said first region of said semiconductor film wherein said first region of said semiconductor film includes a $Si_{1-X}Ge_X$ film where $0<X<1$ by adding germanium;

adding a crystallization promoting material to said first and second regions of said semiconductor film;

heating said first and second regions of said semiconductor film; and patterning said first and second regions of said semiconductor film after said heating step, wherein said first region of said semiconductor film includes a polycrystalline $Si_{1-X}Ge_X$ film where $0<X<1$ by said heating step and said second region of said semiconductor film includes an amorphous semiconductor film after said heating step.

2. A method for forming a semiconductor device according to claim 1, wherein said crystallization promoting material comprises an clement selected from the group consisting of nickel, cobalt, iron, copper, palladium, platinum, gold and indium.

3. A method for forming a semiconductor device according to claim 1, wherein said heating step is carried out in a temperature range of from 550 to 650° C.

4. A semiconductor device according to claim 1, wherein said first region of said semiconductor film includes nickel at a concentration of $1\times10^{15}$ to $1\times10^{16}$ atoms/cm$^3$.

5. A method for forming a semiconductor device, forming an amorphous semiconductor film comprising silicon having a first region and a second region on an insulating film;

adding germanium to said first region of said amorphous semiconductor film wherein said first region of said amorphous semiconductor film includes an amorphous $Si_{1-X}Ge_X$ film where $0<X<1$ by adding germanium;

adding a crystallization promoting material to said amorphous semiconductor film; and heating said amorphous semiconductor film, wherein said first region of said amorphous semiconductor film includes a polycrystalline $Si_{1-X}Ge_X$ film where $0<X<1$ by said heating step and said second region of said amorphous semiconductor film remains as said amorphous semiconductor film after said heating step;

further comprising a step of forming a first active layer and a second active layer by patterning said first region of said polycrystalline $Si_{1-X}Ge_X$ film where $0<X<1$ and said second region of said amorphous semiconductor film; and wherein said first active layer is used in a driver circuit and said second active layer is used in a pixel portion.

6. A method for forming a semiconductor device according to claim 5, wherein said crystallization promoting material comprises an element selected from the group consisting of nickel, cobalt, iron, copper, palladium, platinum, gold and indium.

7. A method for forming a semiconductor device according to claim 5, wherein said heating step is carried out in a temperature range of from 550 to 650° C.

8. A semiconductor device according to claim 5, wherein said first region of said semiconductor film includes nickel at a concentration of $1\times10^{15}$ to $1\times10^{16}$ atoms/cm$^3$.

9. A method for forming a semiconductor device,
  forming an amorphous semiconductor film comprising silicon having a first region and a second region on an insulating film;
  adding germanium to said first region of said amorphous semiconductor film wherein said first region of said amorphous semiconductor film includes an amorphous $Si_{1-X}Ge_X$ film where $0<X<1$ by adding germanium;
  adding a crystallization promoting material to said amorphous semiconductor film; and
  heating said amorphous semiconductor film,
  wherein said first region of said amorphous semiconductor film includes a polycrystalline $Si_{1-X}Ge_X$ film where $0<X<1$ by said heating step and said second region of said amorphous semiconductor film remains as said amorphous semiconductor film after said heating step.

10. A method for forming a semiconductor device according to claim 9, wherein said crystallization promoting material comprises an element selected from the group consisting of nickel, cobalt, iron, copper, palladium, platinum, gold and indium.

11. A method for forming a semiconductor device according to claim 9, wherein said heating step is carried out in a temperature range of from 550 to 650° C.

12. A semiconductor device according to claim 9, wherein said first region of said semiconductor film includes nickel at a concentration of $1\times10^{15}$ to $1\times10^{16}$ atoms/cm$^3$.

* * * * *

UNITED STATES PATENT AND TRADEMARK OFFICE
CERTIFICATE OF CORRECTION

PATENT NO. : 7,678,624 B2  Page 1 of 1
APPLICATION NO. : 11/519514
DATED : March 16, 2010
INVENTOR(S) : Shunpei Yamazak and Takeshi Fukunagai It is certified that error appears in the above-identified patent and that said Letters Patent is hereby corrected as shown below:

Column 12, Claim 2, Line 37, Change "clement" to -- element --.

Signed and Sealed this

Thirty-first Day of August, 2010

David J. Kappos
*Director of the United States Patent and Trademark Office*